(12) United States Patent
Lee et al.

(10) Patent No.: US 10,319,745 B2
(45) Date of Patent: Jun. 11, 2019

(54) DISPLAY PANEL HAVING IMPROVED BRIGHTNESS AND METHOD FOR FABRICATING THE SAME

(71) Applicant: Samsung Display Co., Ltd., Yongin, Gyeonggi-Do (KR)

(72) Inventors: Dae Young Lee, Seoul (KR); Byung Du Ahn, Hwaseong-si (KR); Jung Gun Nam, Suwon-si (KR); Gug Rae Jo, Asan-si (KR)

(73) Assignee: Samsung Display Co., Ltd. (KR)

( * ) Notice: Subject to any disclaimer, the term of this patent is extended or adjusted under 35 U.S.C. 154(b) by 519 days.

(21) Appl. No.: 14/813,556

(22) Filed: Jul. 30, 2015

(65) Prior Publication Data

US 2016/0181281 A1 Jun. 23, 2016

(30) Foreign Application Priority Data

Dec. 19, 2014 (KR) ........................ 10-2014-0184549

(51) Int. Cl.
*H01L 27/12* (2006.01)
*H01L 51/52* (2006.01)
(Continued)

(52) U.S. Cl.
CPC ........ *H01L 27/124* (2013.01); *H01L 27/1262* (2013.01); *H01L 29/78633* (2013.01);
(Continued)

(58) Field of Classification Search
CPC ....... H01L 2924/13081; H01L 29/7831; H01L 29/78645; H01L 29/8124
See application file for complete search history.

(56) References Cited

U.S. PATENT DOCUMENTS

| 6,160,598 A | 12/2000 | Lyu |
| 6,243,199 B1 | 6/2001 | Hansen et al. |

(Continued)

FOREIGN PATENT DOCUMENTS

| CN | 103531640 A | 1/2014 |
| EP | 2682811 A1 | 1/2014 |

(Continued)

OTHER PUBLICATIONS

Partial European Search Report, European Patent Office, dated Apr. 22, 2016, 7 pages, Berlin, Germany.

*Primary Examiner* — David C Spalla
(74) *Attorney, Agent, or Firm* — Innovation Counsel LLP

(57) ABSTRACT

A display panel comprises a substrate, a gate line, a data line insulated from the gate line, a thin film transistor electrically connected to the gate line and the data line, wherein the thin film transistor comprises a gate electrode group formed on the substrate, a gate insulating film formed on the gate electrode group, an active layer formed on the gate insulating film to at least partially overlap the gate electrode group and a source electrode and a drain electrode formed on the active layer so as to be spaced apart from each other, wherein the gate electrode group includes a first gate electrode formed on the substrate, a second gate electrode formed on the first gate electrode, and an insulating layer between the first gate electrode and the second gate electrode, and wherein the first gate electrode has reflectivity higher than that of the second gate electrode.

12 Claims, 45 Drawing Sheets

(51) Int. Cl.
*H01L 29/786* (2006.01)
*H01L 29/49* (2006.01)
(52) U.S. Cl.
CPC .... *H01L 29/78645* (2013.01); *H01L 29/4908* (2013.01); *H01L 29/7869* (2013.01)

(56) References Cited

U.S. PATENT DOCUMENTS

| | | | |
|---|---|---|---|
| 8,934,069 B2* | 1/2015 | Nishizawa | G02F 1/133553 349/62 |
| 2005/0007512 A1 | 1/2005 | Matsunaga et al. | |
| 2005/0275038 A1 | 12/2005 | Shih et al. | |
| 2008/0100781 A1* | 5/2008 | Choo | G02F 1/133536 349/96 |
| 2008/0135837 A1* | 6/2008 | Kim | H01L 29/4908 257/40 |
| 2009/0052030 A1 | 2/2009 | Kaida et al. | |
| 2011/0013106 A1* | 1/2011 | Liu | G02F 1/136286 349/46 |
| 2011/0101346 A1* | 5/2011 | Tateishi | H01L 27/12 257/43 |
| 2011/0285942 A1 | 11/2011 | Guo et al. | |
| 2012/0057106 A1 | 3/2012 | Park et al. | |
| 2013/0270223 A1 | 10/2013 | Lee et al. | |
| 2014/0293187 A1 | 10/2014 | Nam et al. | |
| 2015/0009460 A1* | 1/2015 | Jang | G02F 1/136209 349/106 |

FOREIGN PATENT DOCUMENTS

| | | |
|---|---|---|
| KR | 10-2008-0037324 A | 4/2008 |
| KR | 10-2014-0030382 A | 3/2014 |
| WO | 03036376 A1 | 5/2003 |

* cited by examiner

DISPLAY PANEL HAVING IMPROVED BRIGHTNESS AND METHOD FOR FABRICATING THE SAME

CROSS-REFERENCE TO RELATED APPLICATION

This application claims priority to, and the benefit of, Korean Patent Application No. 10-2014-0184549 filed on Dec. 19, 2014 in the Korean Intellectual Property Office, the disclosure of which is incorporated herein by reference in its entirety.

BACKGROUND

1. Field of the Invention

Embodiments of the present invention relate generally to flat panel displays. More specifically, embodiments of the present invention relate to display panels having improved brightness and fabrication methods therefor.

2. Description of the Related Art

A display device is a device that visually displays data. The display device may include a liquid crystal display, an electrophoretic display, an organic light emitting display, an inorganic EL display (Electro Luminescent Display), a field emission display, a surface-conduction electron-emitter display, a plasma display, a cathode ray display or the like.

The liquid crystal display displays a desired image by disposing a liquid crystal layer between two transparent substrates and by controlling the light transmittance for each pixel in accordance with driving of the liquid crystal layer.

Since the liquid crystal itself cannot emit light in such a liquid crystal display, a separate light source unit is installed in the display to adjust the intensity of passing light through the liquid crystal installed in each pixel and realize gradation (contrast).

Here, the brightness of the display device can be determined depending on how the light incident from the light source unit is used.

SUMMARY

Aspects of the present invention provide a display panel with excellent brightness and a method for fabricating the same.

The aspects of the present invention are not restricted to those in the embodiments set forth herein, and other aspects that have not been mentioned will be clearly understood by those skilled in the art from the following description.

A display panel according to an embodiment of the present invention comprises a substrate, a gate line which is formed on the substrate and extends substantially in a first direction, a data line which is insulated from the gate line and extends substantially in a second direction, a thin film transistor which is electrically connected to the gate line and the data line and a pixel electrode which is electrically connected to the thin film transistor.

The thin film transistor comprises a gate electrode group which is formed on the substrate, a gate insulating film which is formed on the substrate and the gate electrode group, an active layer which is formed on the gate insulating film to at least partially overlap the gate electrode group, and a source electrode and a drain electrode which are formed on the active layer and the gate insulating film so as to be spaced apart from each other. The gate electrode group includes a first gate electrode formed on the substrate, a second gate electrode formed on the first gate electrode, and an insulating layer interposed between the first gate electrode and the second gate electrode. The first gate electrode has a reflectivity higher than that of the second gate electrode.

The first gate electrode and the second gate electrode may be electrically insulated from each other. The gate line may be electrically connected to the second gate electrode. The thickness of the first gate electrode may be less than that of the second gate electrode.

The display panel may further comprise a polarizing plate positioned between the substrate and the gate line. The polarizing plate may be a wire grid polarizing plate which includes a plurality of parallel conductive wire patterns. The wire grid polarizing plate may further include an electrically insulating protective film positioned between the conductive wire patterns and the gate line.

The first gate electrode may have a thickness between about 10 nm and about 100 nm. The first gate electrode may also comprise at least one of aluminum and silver, and the second gate electrode may comprise copper.

A method of fabricating a display panel according to an embodiment of the present invention comprises forming a first gate electrode on a substrate, forming an insulating layer on the first gate electrode, forming a second gate electrode on the insulating layer, the second gate electrode having a reflectivity lower than that of the first gate electrode; forming a gate insulating film on the substrate and the second gate electrode, forming an active layer on the gate insulating film so as to at least partially overlap the second gate electrode, forming a source electrode and a drain electrode on the active layer at positions spaced apart from each other, and forming a pixel electrode which is electrically connected to the drain electrode.

In the method, the first gate electrode may comprise at least one of aluminum and silver, and the second gate electrode may comprise copper.

The first gate electrode and the second gate electrode may be formed using the same mask.

The first gate electrode, the insulating film and the second gate electrode may be formed using the same mask.

The forming the first gate electrode may include forming a wire grid polarizing plate on the substrate and forming the first gate electrode on the wire grid polarizing plate.

The forming the wire grid polarizing plate may include forming conductive wire patterns on the substrate and forming a protective film on the conductive wire patterns.

According to the embodiments of the present invention, there are at least the following effects.

It is possible to provide a display panel with excellent brightness.

Effects of the present invention are not limited by the contents exemplified above, and various further effects are included herein.

BRIEF DESCRIPTION OF THE DRAWINGS

The above and other aspects and embodiments of the present invention will become more apparent by describing in detail exemplary embodiments thereof with reference to the attached drawings, in which.

DETAILED DESCRIPTION OF THE EMBODIMENTS

Figure 1:
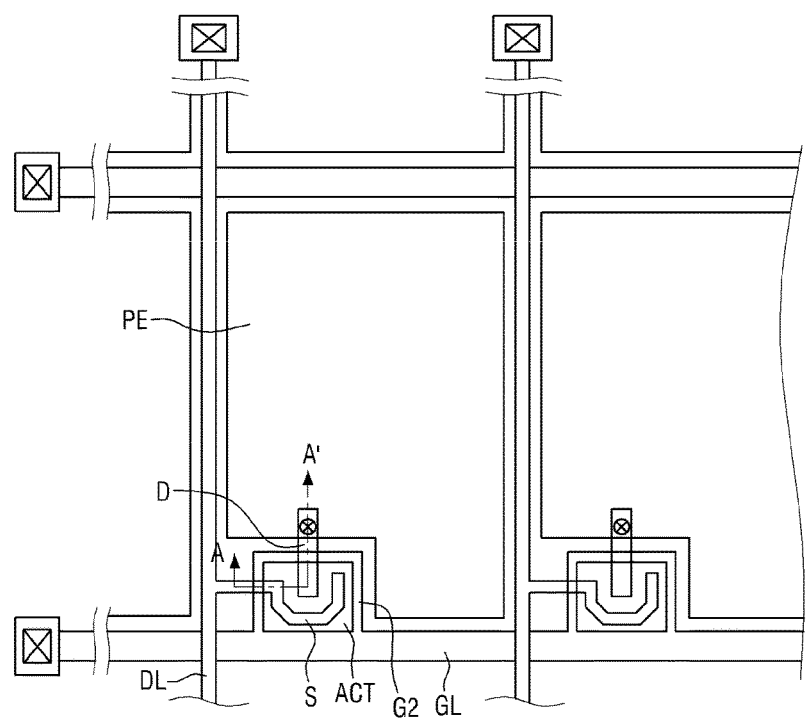
FIG. 1 is a plan view of a display panel according to an embodiment of the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of "may" when describing embodiments of the inventive concept refers to "one or more embodiments of present invention". The term "exemplary" is intended to refer to an example or illustration. As used herein, the terms "use," "using," and "used" may be considered synonymous with the terms "utilize," "utilizing," and "utilized," respectively.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention. Further, the various Figures are not to scale.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein. All numerical values are approximate, and may vary.

Embodiments of the present invention will now be described with reference to the drawings.

Figure 2:
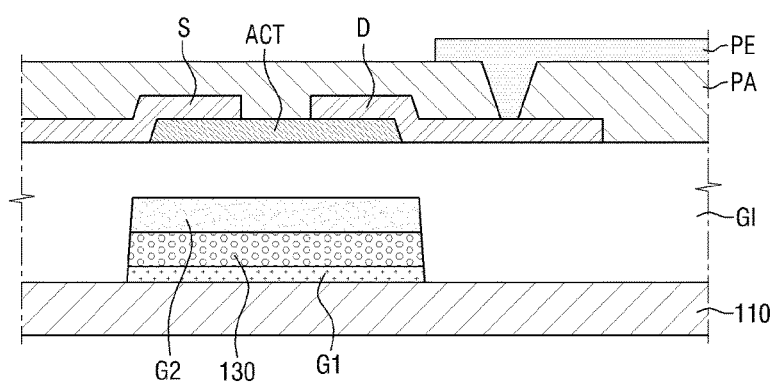
FIG. 2 is a cross-sectional view of a region A-A' of FIG. 1.

FIG. 1 is a plan view of a display panel according to an embodiment of the present invention, and FIG. 2 is a cross-sectional view of the region A-A' of FIG. 1.

Referring to these drawings, a display panel according to an embodiment of the present invention can include a substrate 110, a gate line GL formed on the substrate 110 and extending in a first direction, a data line DL insulated from the gate line GL and extending in a second direction, a thin film transistor G1, G2, ACT, S and D electrically connected to the gate line GL and the data line DL, and a pixel electrode PE electrically connected to the thin film transistor.

Each thin film transistor can include a gate electrode group which includes a first gate electrode G1 formed on the substrate 110, an insulating layer 130 formed on the first gate electrode G1 and a second gate electrode G2 formed on the insulating layer 130; a gate insulating film G1 formed on the gate electrode group and the substrate 110; an active layer ACT formed on the gate insulating film G1 in a region at least partially overlapping the gate electrode group; and a source electrode S and a drain electrode D formed on the active layer ACT and the gate insulating film G1 so as to be spaced apart from each other.

Here, the first gate electrode G1 can have reflectivity higher than that of the second gate electrode G2. Accordingly, light incident from a backlight unit (not shown) located in the bottom is reflected by non-opening regions, which makes it possible to improve the overall brightness of the display.

The substrate 110 can have a plate-like shape (e.g., substantially flat or planar) and can support other structures formed on the substrate 110. As long as the substrate 110 is able to transmit visible light while having insulating properties, its material can be appropriately selected according to the application or process. For example, the substrate 110 may be made of various polymers, such as glass, quartz, acryl, TAC (triacetylcellulose), COP (cyclic olefin polymer), COC (cyclic olefin copolymer), PC (polycarbonate), PET (polyethylenenaphthalate) and PES (polyethersulfone), but the material is not limited only to these specific examples. The substrate 110 can be formed of an optical film base material having a certain degree of flexibility.

The first gate electrode G1 can be formed on the substrate 110. In an exemplary embodiment, a buffer layer (not shown) can be additionally formed between the substrate 110 and the first gate electrode G1. The buffer layer can prevent the entry of impurity elements and can flatten the top surface of the substrate 110. The buffer layer can be formed of various materials capable of performing such functions. For example, one of a silicon nitride film, a silicon oxide film and a silicon oxynitride film can be used as a buffer layer, though these are but nonlimiting examples.

The first gate electrode G1 may be made of, as nonlimiting examples, a metal having relatively high reflectivity. For example, aluminum (Al), silver (Ag) and the like can be used.

The insulating layer 130 may be made of any suitable electrically insulating material, and as nonlimiting examples it is possible to use a metal oxide, a metal nitride, a silicon oxide, a silicon nitride and the like.

The second gate electrode G2 may comprise any suitable electrically conductive material, and in particular need not be limited to a material with high reflectivity. For example, in the case of recent high-resolution products, nonlimiting examples of suitable materials include copper having low resistance or the like. A low resistance material may be preferred in some applications in order to minimize an increase in resistance due to slimming of wiring or the like. Also, when using copper, in order to compensate for problems such as diffusion that may occur between copper and an oxide layer, it is possible to additionally form a convex layer (not shown) or a capping layer (not shown) on the surface of the copper.

In one example, the first gate electrode G1, the insulating layer 130 and the second gate electrode G2 can be formed so as to be vertically superimposed one upon the other. This configuration can be formed using a single mask during the fabrication process.

The second gate electrode G2 may be electrically connected to the gate line GL. This enables the gate voltage to be applied to the second gate electrode G2 from the gate line GL.

The gate insulating film GI can be formed on the substrate 110 and the second gate electrode G2. The gate insulating film GI can insulate the active layer ACT and the second gate electrode G2 from each other and can be formed to cover the second gate electrode G2.

The gate insulating film GI may comprise any suitable insulating material. Nonlimiting examples of such materials include oxides, nitrides or the like. In one example, the gate insulating film GI may be made of, but is not limited to, the same material as that of the insulating layer 130.

The active layer ACT can be made of any suitable semiconductor material that can form a channel from a voltage being applied to the second gate electrode G2. It is also possible to use an oxide semiconductor or the like, in addition to many well-known general semiconductor materials.

A source electrode S is at least partially disposed on the active layer ACT, and a drain electrode D is spaced apart from the source electrode S and can also be at least partially disposed on the active layer ACT so as to at least partially face the source electrode S.

The source electrode S may be electrically connected to the data line DL. This enables the data voltage to be applied to the source electrode S from the data line DL.

A passivation film PA can be formed on the source electrode S, the drain electrode D, the active layer ACT and the gate insulating film GI. The passivation film PA acts to flatten the top of the thin film transistor and to electrically connect the pixel electrode PE and the drain electrode D through a contact hole that exposes a part of the drain electrode D.

The passivation film PA can be formed of an insulating material and can be formed of, as nonlimiting examples, one or more of an acrylic resin (polyacrylates resin), epoxy resin, phenolic resin, polyamides resin, polyimides rein, unsaturated polyesters resin, poly phenylenethers resin, poly phenylene sulfides resin and benzocyclobutene (BCB). Also, the passivation film PA may be formed of, but not limited only to, inorganic materials such as SiOx, SiNx and SiOC.

Figure 3:
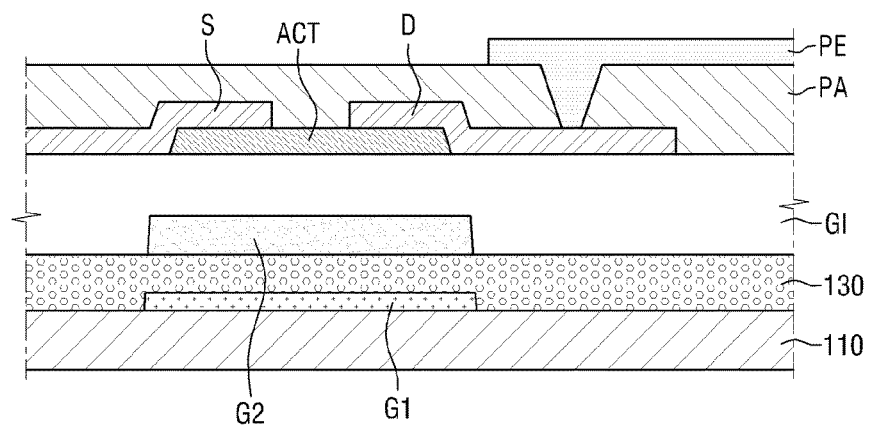
FIG. 3 is a cross-sectional view of a display panel according to another embodiment of the present invention.

FIG. 3 is a vertical cross-sectional view of a display panel according to another embodiment of the present invention.

Referring to FIG. 3, the display panel according to another embodiment of the present invention can include a substrate 110, a gate line GL formed on the substrate 110 and extending in a first direction, a data line DL insulated from the gate line GL and extending in a second direction, a thin film transistor G1, G2, ACT, S and D electrically connected to the gate line GL and the data line DL, and a pixel electrode PE electrically connected to the thin film transistor.

Each thin film transistor can include a first gate electrode G1 formed on the substrate 110, an insulating layer 130 formed on the substrate 110 and the first gate electrode G1, a second gate electrode G2 formed on the insulating layer 130, a gate insulating film GI formed on the second gate electrode G2 and the insulating layer 130, an active layer ACT formed on the gate insulating film GI in a region at least partially overlapping the second gate electrode G2, and a source electrode S and a drain electrode D formed at least partially on the active layer ACT and the gate insulating film GI so as to be spaced apart from each other.

In one example, the first gate electrode G1 and the second gate electrode G2 can be formed so as to be vertically superimposed with each other, i.e. to overlap each other in plan view. This can be formed using the same mask in the fabricating process. The insulating layer 130 located between the first gate electrode G1 and the second gate electrode G2 can be formed over substantially the whole surface of the substrate 110 without using a separate mask.

Since other configurations of FIG. 3 are identical or correspond to those of FIG. 2, any redundant description will not be provided.

Figure 4:
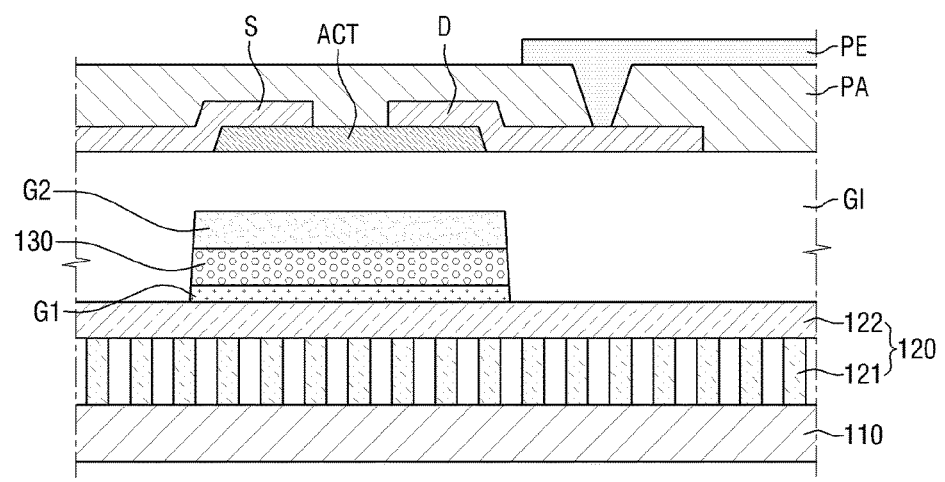
FIG. 4 is a cross-sectional view of a display panel according to another embodiment of the present invention.

FIG. 4 is a cross-sectional view of a display panel according to another embodiment of the present invention.

Referring to FIG. 4, a display panel according to another embodiment of the present invention can include a substrate 110, a wire grid polarizing plate 120; a gate line GL formed on the protective film 122 and extending in a first direction, a data line DL insulated from the gate line GL and extending in a second direction, thin film transistors G1, G2, ACT, S and D electrically connected to the gate line GL and the data line DL, and a pixel electrode PE electrically connected to the thin film transistors. The wire grid polarizing plate 120 includes conductive wire patterns 121 formed on the substrate 110 and a protective film 122 formed on the conductive wire patterns 121 so as to be spaced apart from the substrate 110.

Each thin film transistor can include a gate electrode group which includes a first gate electrode G1 formed on the protective film 122, an insulating layer 130 formed on the first gate electrode G1 and a second gate electrode G2 formed on the insulating layer 130; a gate insulating film GI formed on the gate electrode group and the substrate 110; an active layer ACT formed on the gate insulating film GI in a region at least partially overlapping the gate electrode group; and a source electrode S and a drain electrode D formed on the active layer ACT and the gate insulating film GI so as to be spaced apart from each other.

The conductive wire patterns 121 may be arranged side by side, or stacked next to each other, with a constant cycle. The cycle of the conductive wire patterns 121 can have a high polarization extinction ratio as it is shorter than the wavelength of the incident light. However, the shorter the cycle is, the harder that fabrication becomes. A visible ray region is generally in the range from about 380 nm to about 780 nm, and for the wire grid polarizer to have a high extinction ratio for the three primary colors of light of red, green and blue (R, G, B), it is possible to expect the polarization properties if the cycle is at least 200 nm or less. However, in order to exhibit polarization performance that is equal to or greater than currently existing polarizers, the conductive wire patterns 121 can have, but are not limited to, cycles of 120 nm or less.

The conductive wire patterns 121 may be made of any suitable conductive material. In an exemplary embodiment, the conductive wire patterns 121 can be made of metal, and more specifically, can be made of, as nonlimiting examples, a metal selected from the group consisting of aluminum (Al), chromium (Cr), gold (Au), silver (Ag), copper (Cu), nickel (Ni), iron (Fe), tungsten (W), cobalt (Co) and molybdenum (Mo), and alloys thereof.

In some cases, the conductive wire patterns 121 can include two or more layers. For example, a first conductive wire pattern (not shown) can be made of aluminum and a second conductive wire pattern (not shown) may be made of titanium or molybdenum, but the patterns are not limited to this configuration. When the first conductive wire pattern (not shown) is made of aluminum, a hillock may be created depending on the temperature of subsequent processes and the presence of a nonuniform upper surface, which may lower the optical properties of the product. In order to prevent this defect, it is possible to prevent these hillocks, by forming the second conductive wire pattern (not shown) of titanium or molybdenum and on the first conductive wire pattern (not shown).

The width of the conductive wire patterns 121 may be smaller than the cycle of the conductive wire patterns 121, and it can be, as a nonlimiting example, in the range of 10 nm to 200 nm, within the range capable of exhibiting desired polarization performance. The thickness of the conductive wire patterns 121 can be, as nonlimiting example, in the range of 10 nm to 500 nm.

The protective film 122 can be formed to electrically insulate the upper surface of the wire grid polarizer 120 and to flatten the upper surface of the conductive wire patterns 121. The protective film 150 may be made of any suitable transparent material that has non-conductive properties.

In one example, the protective film 122 can be, but is not limited only to, one or more selected from the group consisting of SiOx, SiNx and SiOC. In one example, it can have a structure in which an SiOC layer is sequentially laminated on an SiOx layer. In this case, it is possible to perform deposition only by a change in raw material gas in the same chamber and conditions, and thus, it is possible to enjoy in increase in process efficiency. Further, it is possible to enjoy in increase in process efficiency in term of processing speed because the deposition rate of the SiOC layer is high.

Since other configurations of FIG. 4 are identical to or correspond to those of FIG. 2, any repeated description will not be provided.

Figure 5:
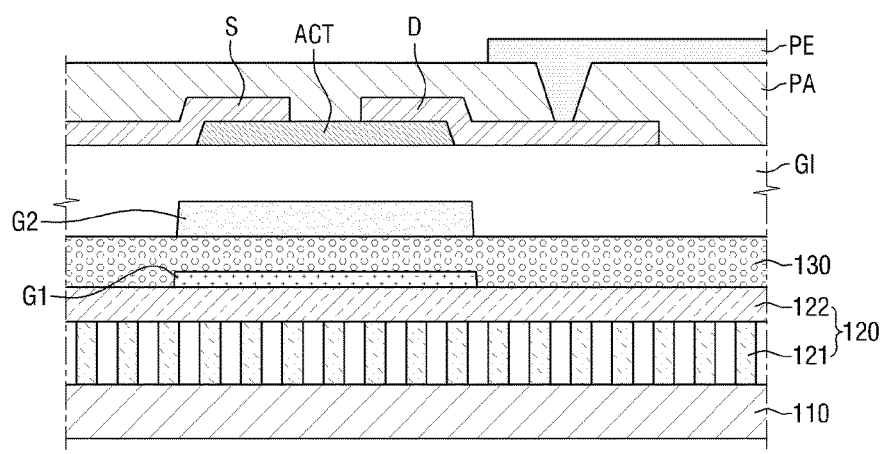
FIG. 5 is a cross-sectional view of a display panel according to another embodiment of the present invention.
Figure 6:
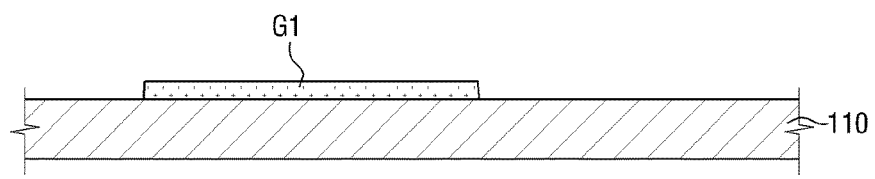
FIGS. 6 to 14 are cross-sectional views of fabricating processes for a display panel according to an embodiment of the present invention.
Figure 7:
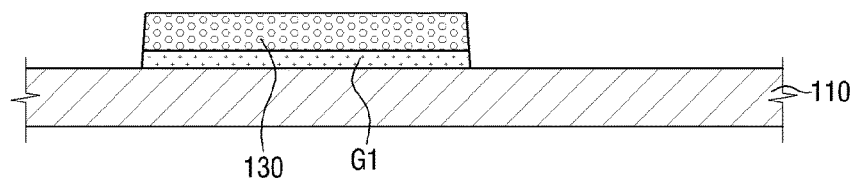
Figure 8:
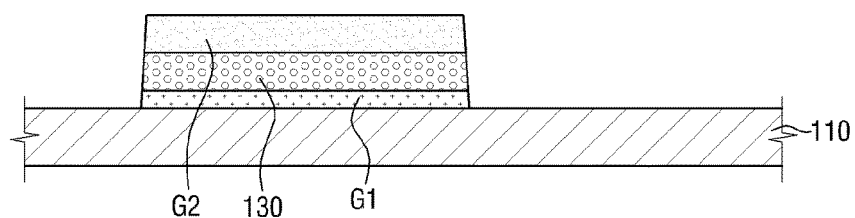
Figure 9:
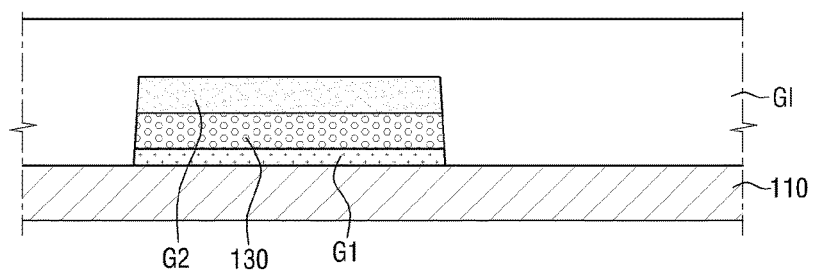
Figure 10:
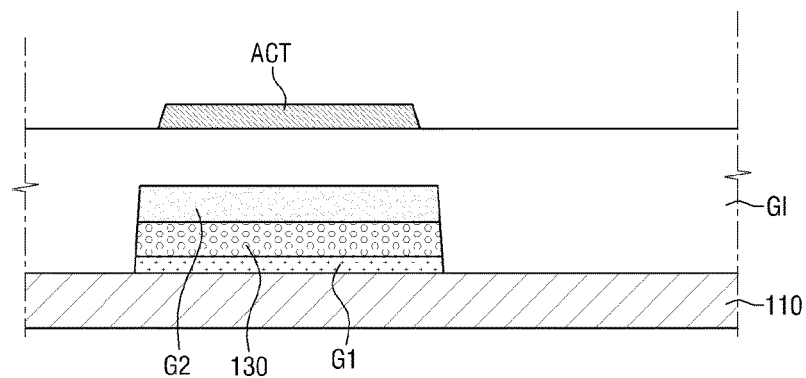
Figure 11:
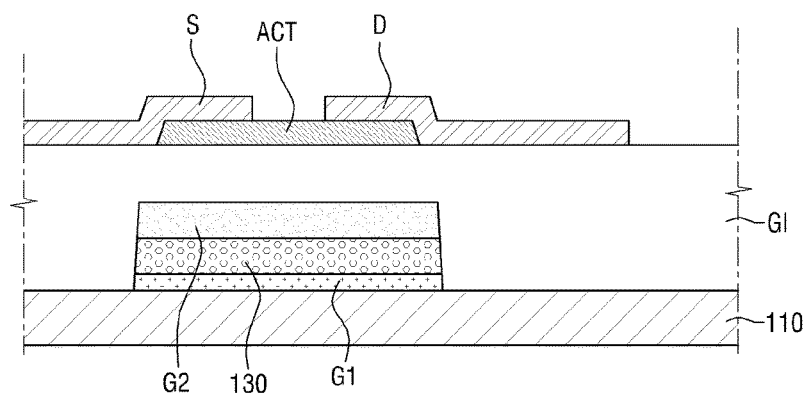
Figure 12:
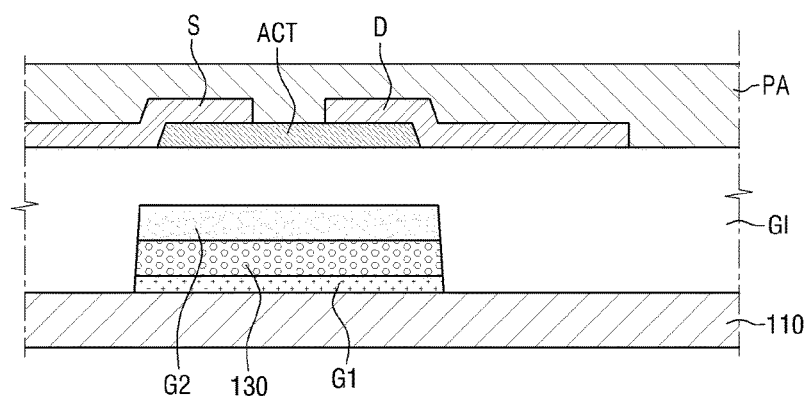
Figure 13:
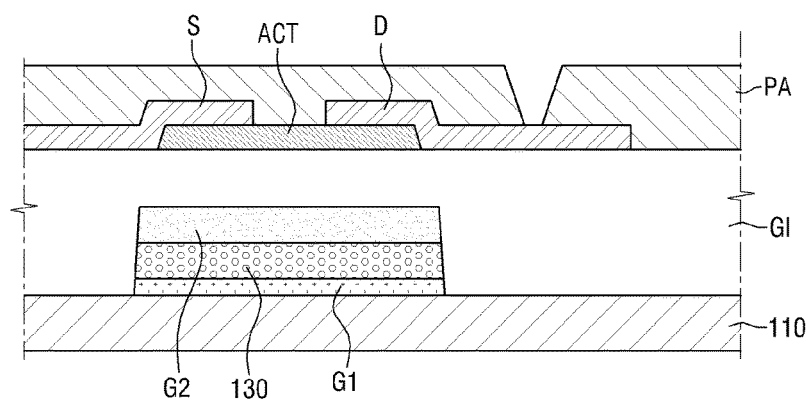
Figure 14:
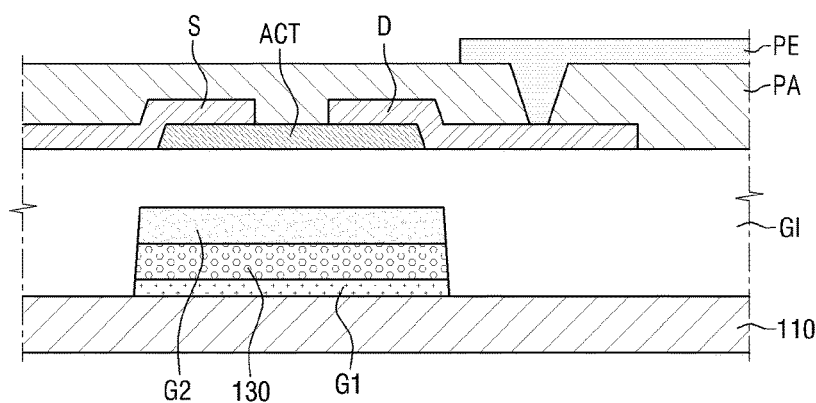
Figure 15:
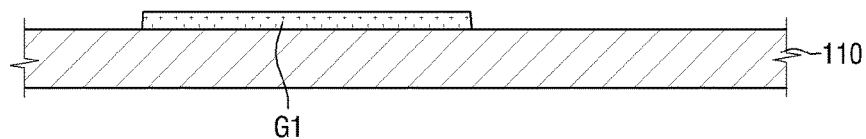
FIGS. 15 to 23 are cross-sectional views of fabricating processes for a display panel according to another embodiment of the present invention.
Figure 16:
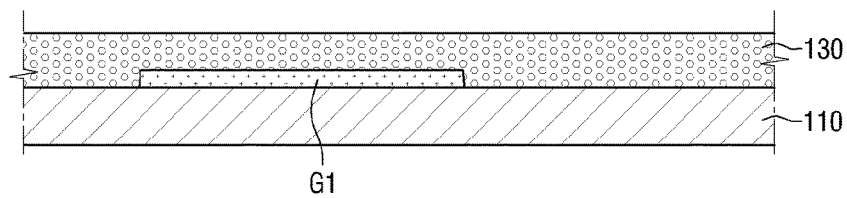
Figure 17:
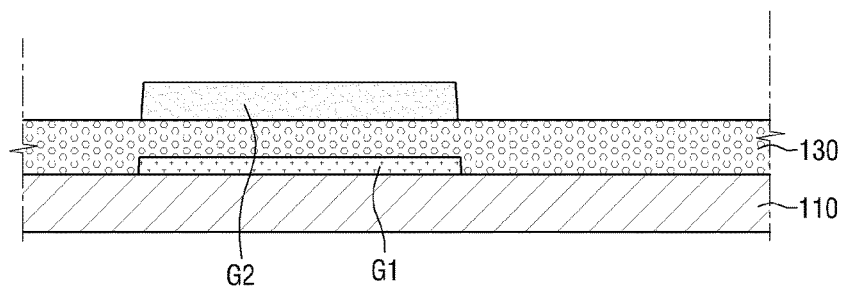
Figure 18:
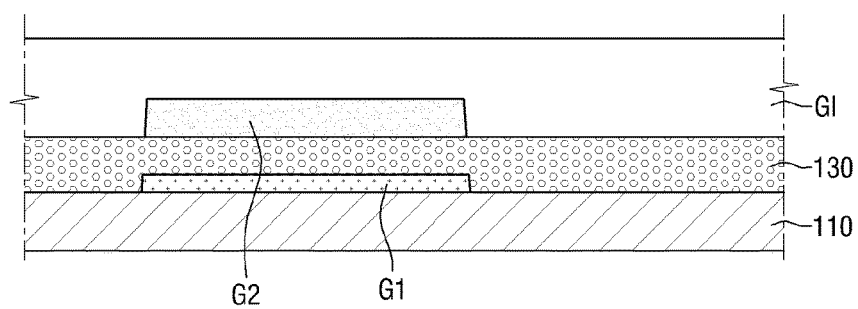
Figure 19:
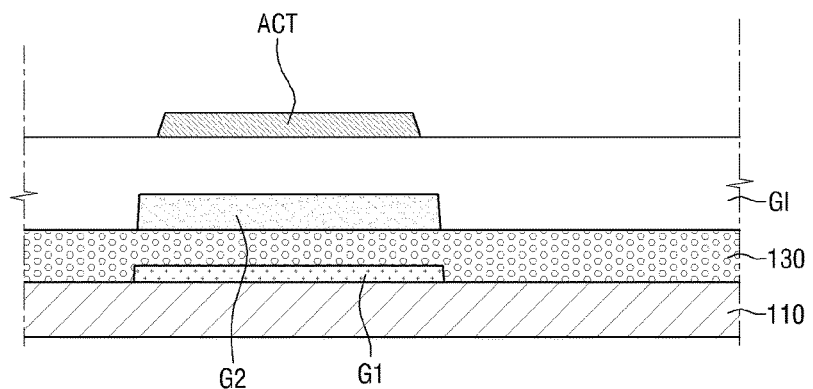
Figure 20:
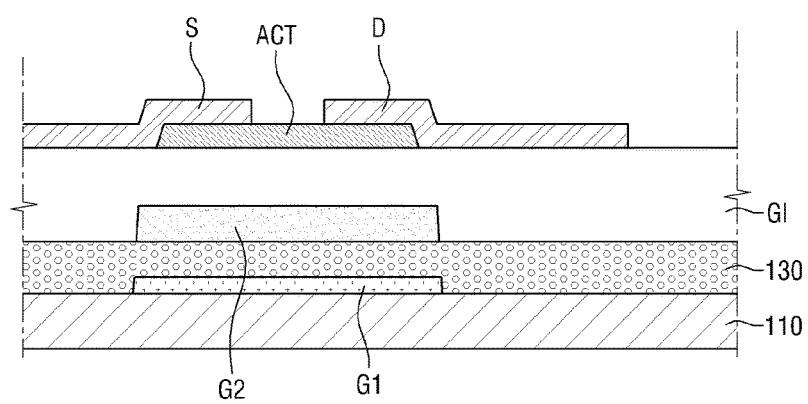
Figure 21:
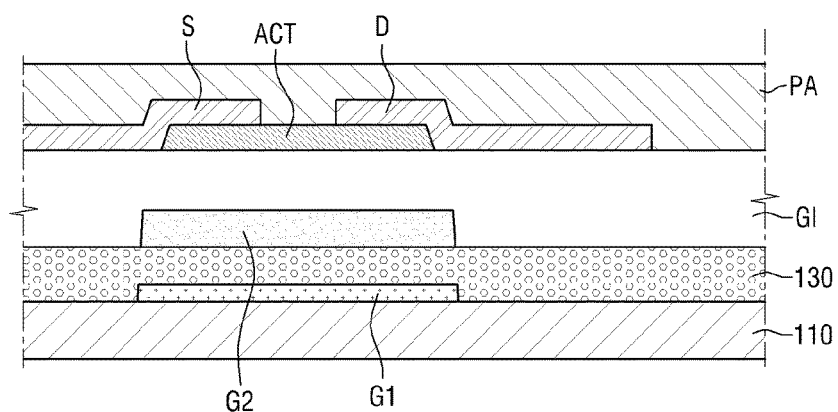
Figure 22:
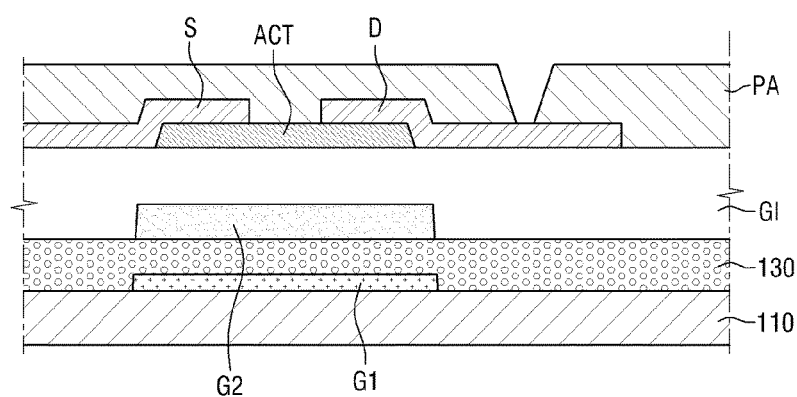
Figure 23:
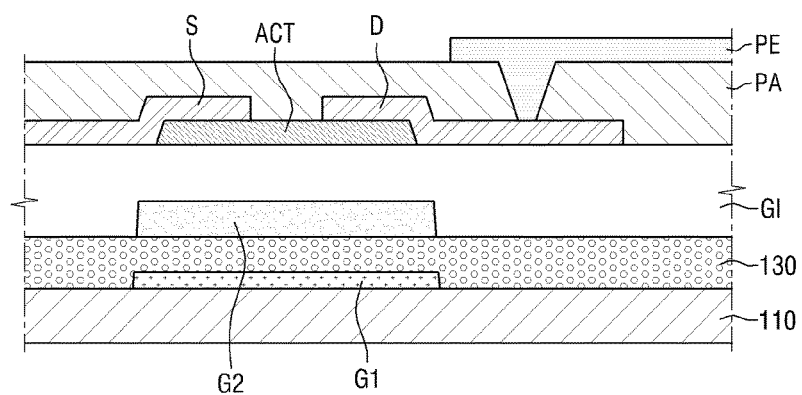
Figure 24:
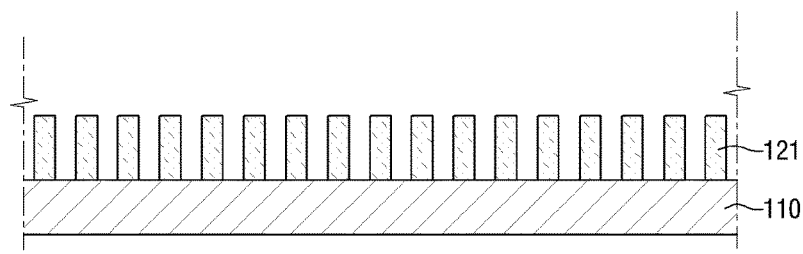
FIGS. 24 to 34 are cross-sectional views of fabricating processes for a display panel according to another embodiment of the present invention.
Figure 25:
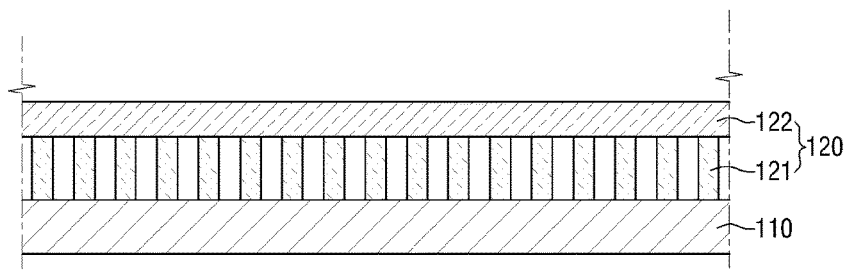
Figure 26:
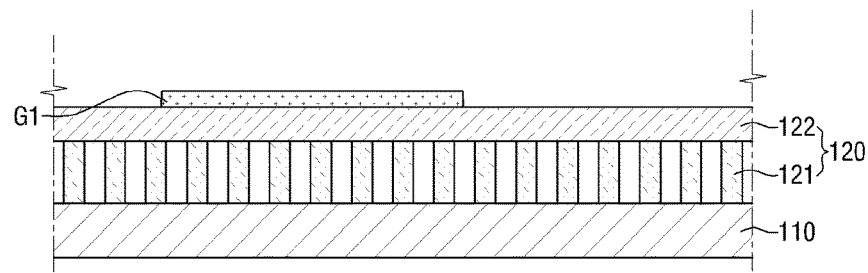
Figure 27:
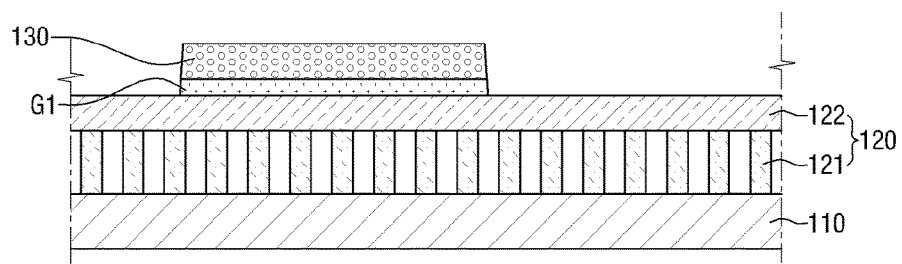
Figure 28:
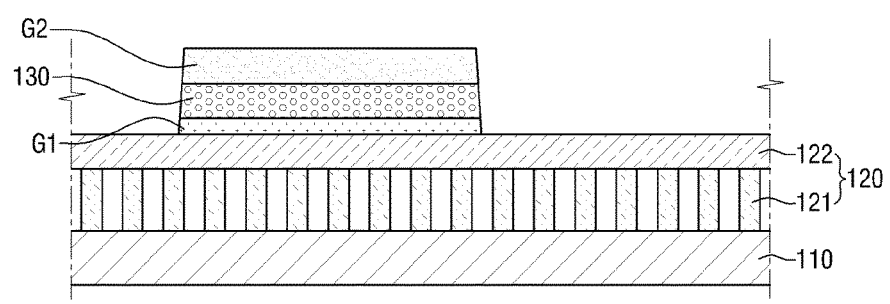
Figure 29:
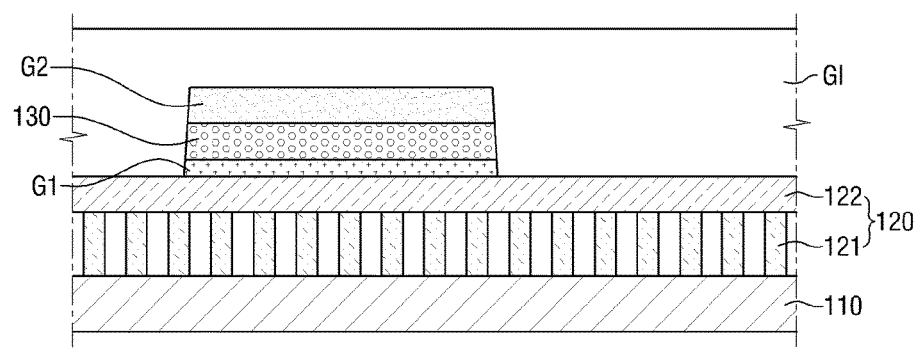
Figure 30:
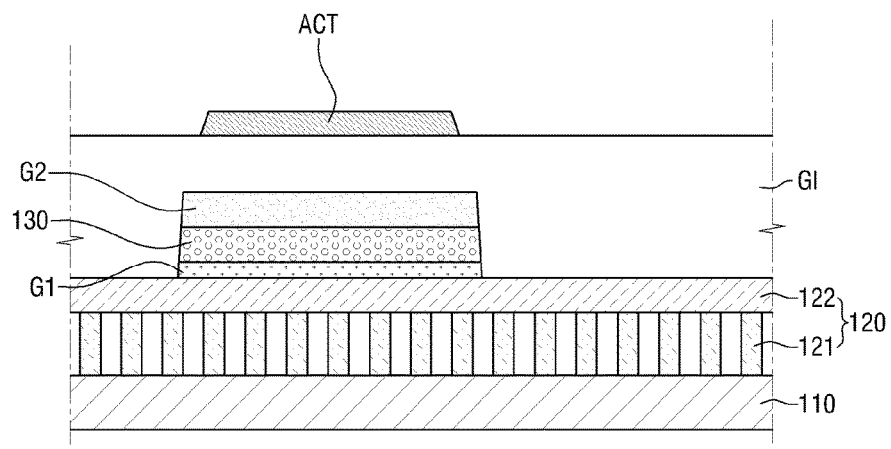
Figure 31:
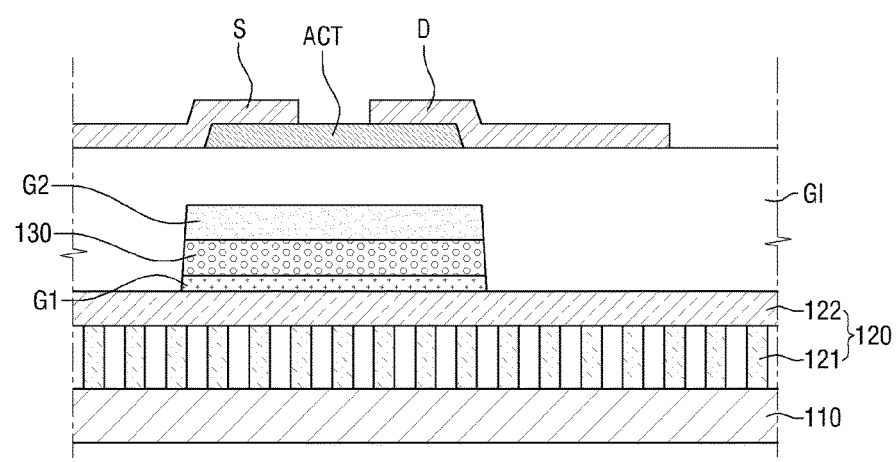
Figure 32:
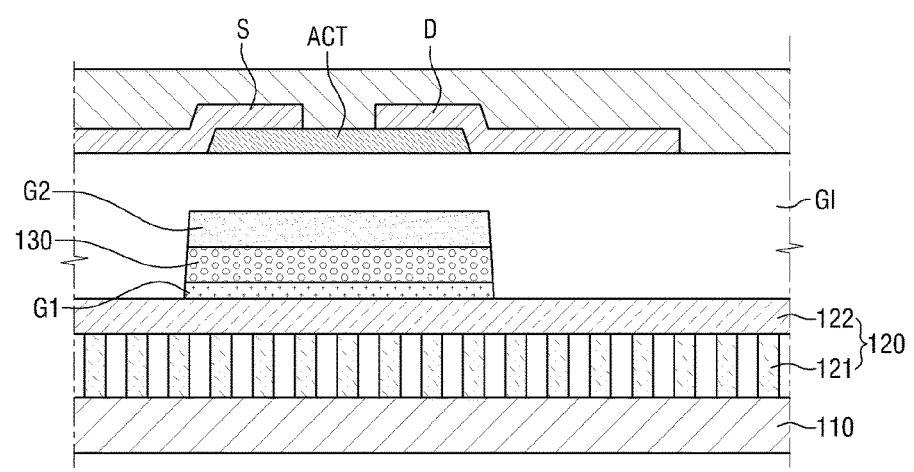
Figure 33:
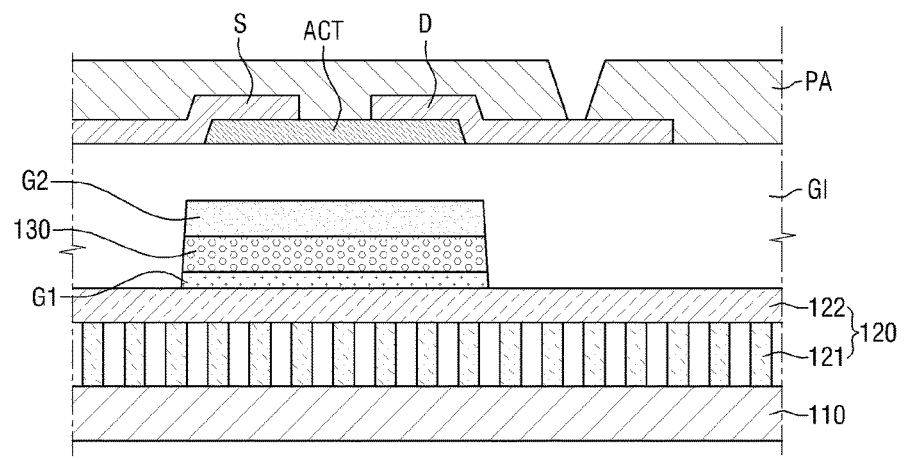
Figure 34:
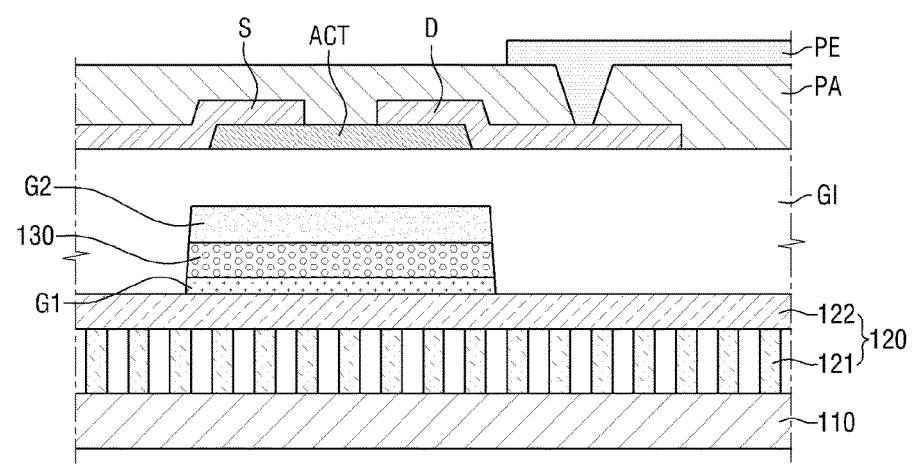
Figure 35:
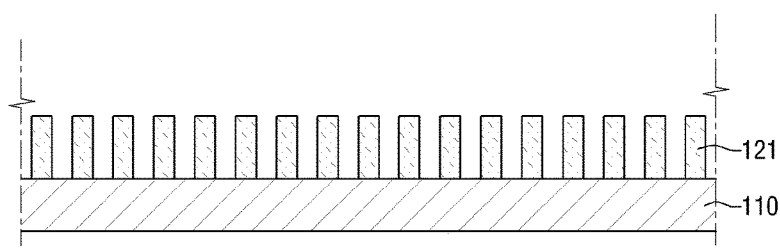
FIGS. 35 to 45 are cross-sectional views of fabricating processes for a display panel according to another embodiment of the present invention.
Figure 36:
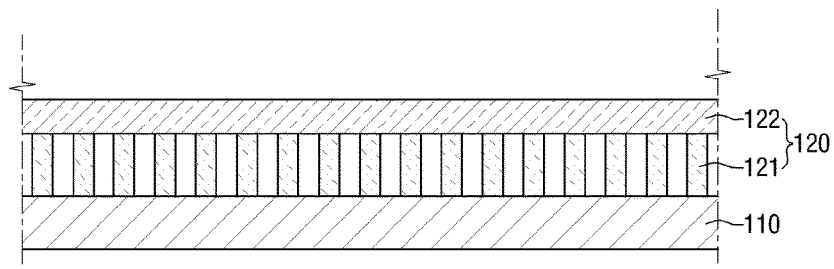
Figure 37:
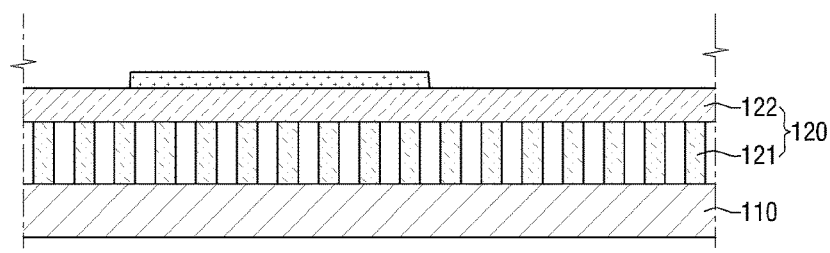
Figure 38:
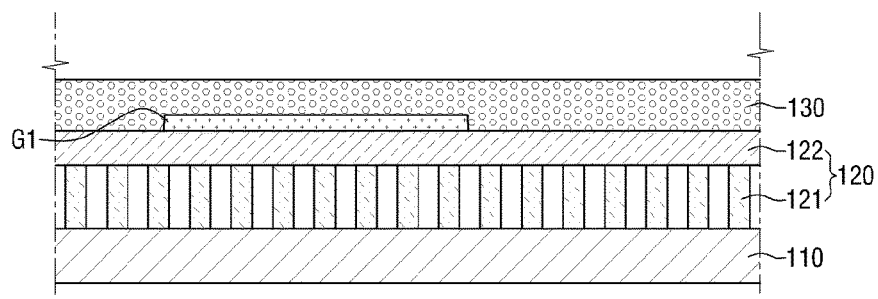
Figure 39:
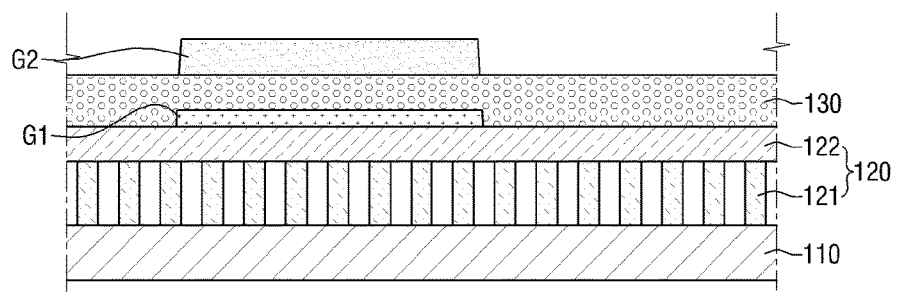
Figure 40:
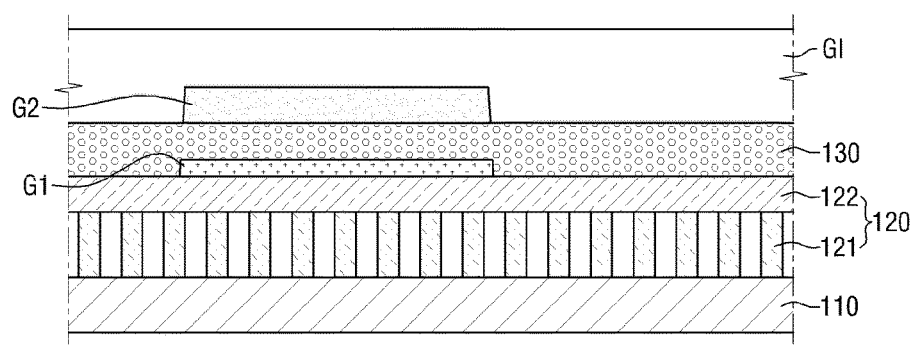
Figure 41:
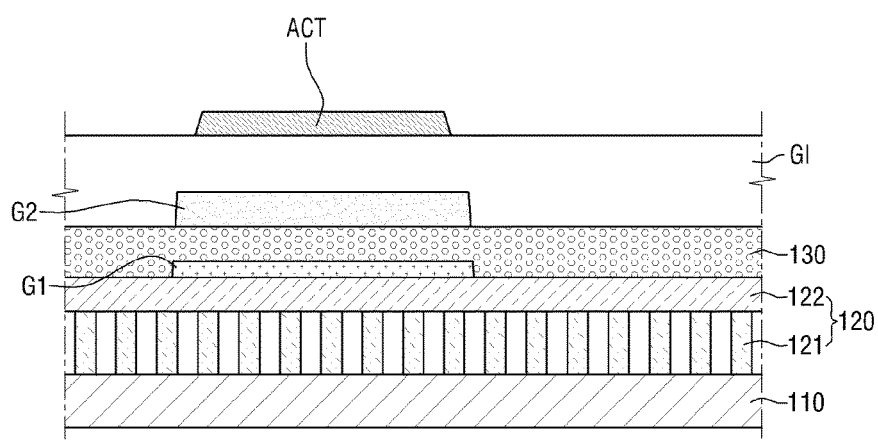
Figure 42:
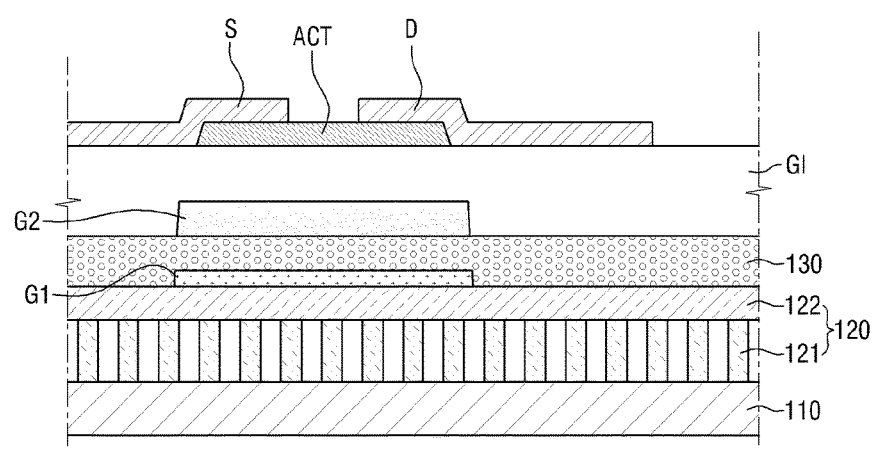
Figure 43:
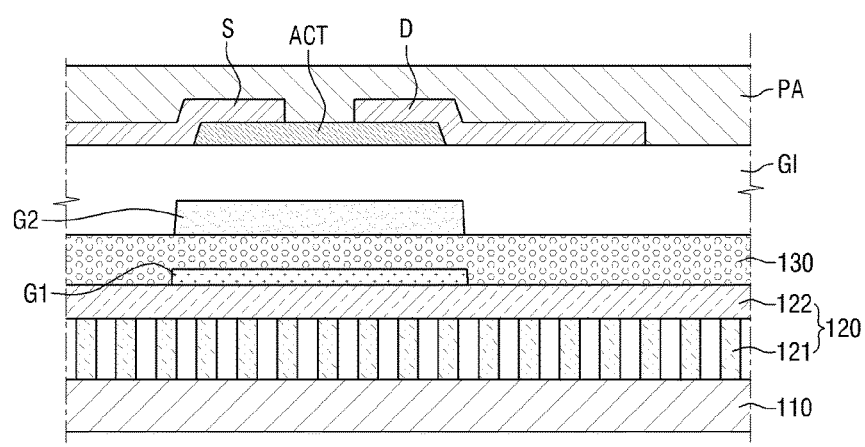
Figure 44:
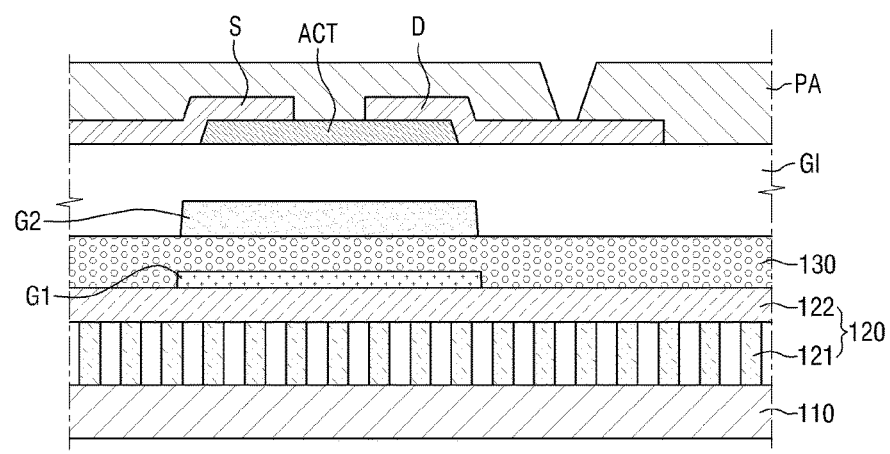
Figure 45:
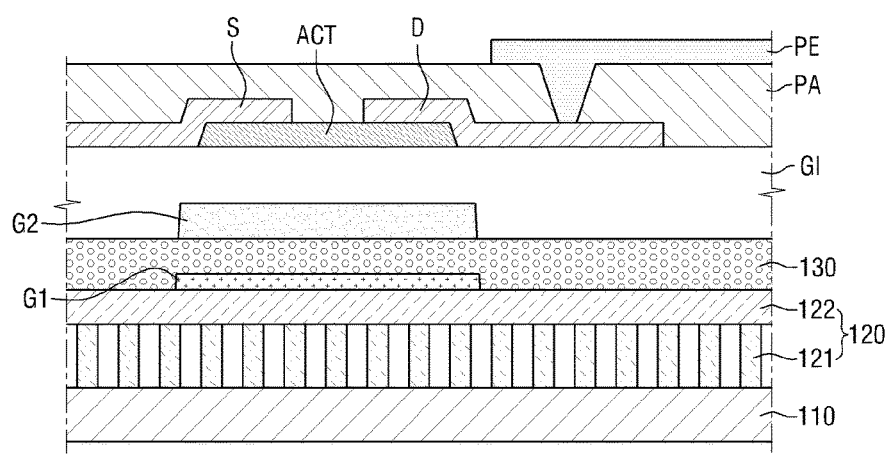

FIG. 5 is a cross-sectional view of a display panel according to another embodiment of the present invention.

Referring to FIG. 5, a display panel according to another embodiment of the present invention can include a substrate 110; a wire grid polarizing plate 120; a gate line GL formed on the protective film 122 and extending in a first direction; a data line DL insulated from the gate line GL and extending in a second direction; thin film transistors G1, G2, ACT, S and D electrically connected to the gate line GL and the data line DL; and a pixel electrode PE electrically connected to the thin film transistors. The wire grid polarizing plate 120 includes conductive wire patterns 121 formed on the substrate 110 and a protective film 122 formed on the conductive wire patterns 121 so as to be spaced apart from the substrate 110.

Each thin film transistor can include a first gate electrode G1 formed on the protective film 122, an insulating layer 130 formed on the protective film 122 and the first gate electrode G1, a second gate electrode G2 formed on the insulating layer 130, a gate insulating film GI formed on the second gate electrode G2 and the insulating layer 130, an active layer ACT formed on the gate insulating film GI in a region at least partially overlapping the second gate electrode G2, and a source electrode S and a drain electrode D formed on the active layer ACT and the gate insulating film GI so as to be spaced apart from each other.

Since the configuration of the wire grid polarizing plate 120 is the same as that of FIG. 4, any repeated description will not be provided.

Since other configurations of FIG. 5 are identical or correspond to those of FIG. 3, any repeated description will not be provided.

FIGS. 6 to 14 are cross-sectional views of a fabricating process for a display panel according to an embodiment of the present invention.

Referring to FIGS. 6-14, in order, the gate electrode G1 can be formed on the substrate 110, the insulating layer 130 can be formed on the first gate electrode G1, and the second gate electrode G2 can be formed on the insulating layer 130

In one example, the first gate electrode G1, the insulating layer 130 and the second gate electrode G2 can be formed using the same mask. It is thus possible to minimize process losses due to replacement of the mask.

The second gate electrode G2 can be formed simultaneously and integrally with the gate line GL of FIG. 1. In this case, the first gate electrode G1 and the insulating layer 130 can also be formed so as to be superimposed with the gate line GL of FIG. 1. This is due to the use of the same mask.

The first gate electrode G1 can be formed by using a material having a higher reflectivity than that of the second gate electrode G2. This makes it possible to improve brightness, in that the first gate electrode G1 reflects more light in the non-opening region.

The gate insulating film GI can be formed on the second gate electrode G2 and the substrate 110. The upper surface of the gate insulating film GI is shown as being flat in FIG. 9, but it is not limited thereto. The gate insulating film GI may be formed in any shape or profile, as long as it is able to insulate the active layer ACT from the second gate electrode G2, which will be formed later, and is able to cover the second gate electrode G2.

The active layer ACT can be formed on the gate insulating film GI in a region that at least partially overlaps the second gate electrode G2.

The source electrode S is at least partially disposed on the active layer ACT, and the drain electrode D is spaced apart from the source electrode S and can be disposed on the active layer ACT while at least partially facing the source electrode S.

The source electrode S and the drain electrode D may be initially deposited as an integral layer, then formed by removing a separation region on the active layer ACT via etching or the like. Removal of the separation region may be accomplished by a patterning process using a mask or any other suitable patterning method.

The source electrode S can be formed simultaneously and integrally with the data line DL of FIG. 1.

The passivation film PA can be formed on the gate insulating film GI, the source electrode S, the drain electrode D and the active layer ACT. The passivation film PA is able to flatten the top of the thin film transistors.

The passivation film PA can be formed of an insulating material and can be formed of, as nonlimiting example, one or more of acrylic resins (polyacrylates resin), epoxy resin, phenolic resin, polyamides resin, polyimides rein, unsaturated polyesters resin, poly phenylenethers resin, poly phenylenesulfides resin and benzocyclobutene (BCB). Also, it may be formed of, as nonlimiting example, inorganic substances such as SiOx, SiNx and SiOC.

A part of the passivation film PA overlapping the drain electrode D can be etched to form a contact hole for exposing the drain electrode D, and the pixel electrode PE can be formed on the passivation layer PA and the drain electrode D, but embodiments of the invention are not limited to any such configuration.

In one example, when the top of the gate insulating film GI is sufficiently flat, it is possible to directly form the pixel electrode PE so as to be at least partially in contact with the drain electrode D, without forming a separate passivation film PA. That is, pixel electrode PE can be formed directly on drain electrode D, without passivation film PA inbetween.

FIGS. 15 to 23 are cross-sectional views of fabricating processes for a display panel according to another embodiment of the present invention.

Referring to these drawings, the first gate electrode G1 can be formed on a substrate 110, the insulating layer 130 can be formed on the first gate electrode G1 and over substantially the entire surface of the substrate 110, and the second gate electrode G2 can be formed on the insulating layer 130 in a region that overlaps, or is positioned over, the first gate electrode G1.

In one example, the first gate electrode G1 and the second gate electrode G2 can be formed using the same mask. In this manner, it is possible to avoid the use of multiple masks, thus reducing manufacturing costs.

Since other configurations of FIGS. 15 to 23 are identical or correspond to those of FIGS. 6 to 14, redundant description will not be provided.

FIGS. 24 to 34 are cross-sectional views of fabricating processes for a display panel according to another embodiment of the present invention.

Referring to these drawings, first, the conductive wire patterns 121 can be formed on the substrate 110, and a protective film 122 spaced apart from the substrate 110 can be formed on the conductive wire patterns 121.

A method for forming the conductive wire patterns 121 includes, but is not limited only to, a nano-imprinting method, a DPT method, a BCP alignment patterning and the like.

After forming the conductive wire patterns 121 but before forming the protective film 122, it may be desirable to prevent the material of the protective film 122 from entering the space between the conductive wire patterns 121. This can be accomplished, as a nonlimiting example, by performing a hydrophobic treatment on the surfaces of the conductive wire patterns 121. Such treatments are known, and any suitable such treatment is contemplated.

The protective film 122 can be, but is not limited only to, one or more selected from the group consisting of, for example, SiOx, SiNx and SiOC. In one example, it may have a structure in which a SiOC layer is laminated on a SiOx layer. In this case, it is possible to perform deposition only by a change in raw material gas in the same chamber and conditions. Additionally, the deposition rate of the SiOC layer is relatively high. Thus, an increase in process efficiency may be realized.

The first gate electrode G1 can be formed on the protective film 122, the insulating layer 130 can be formed on the first gate electrode G1, and the second gate electrode G2 can be formed on the insulating layer 130.

In one example, the first gate electrode G1, the insulating layer 130 and the second gate electrode G2 can be formed using the same mask. This helps to minimize process losses due to replacement of masks.

The second gate electrode G2 can be formed simultaneously and integrally with the gate line GL of FIG. 1. In this case, the first gate electrode G1 and the insulating layer 130 may be formed so as to have substantially the same profile as the gate line GL of FIG. 1. This can be accomplished by using the same mask.

The first gate electrode G1 can be formed of a material having a higher reflectivity than that of the second gate electrode G2. This makes it possible to improve brightness by increasing the amount of light reflected from the non-opening region. That is, a reflective gate electrode G1, typically located in a non-opening region between pixels and under a black matrix or other light-blocking material, acts to reflect light back through the substrate 110 toward the backlight and eventually back up through a pixel, so that less light is lost and the resulting image is brighter.

The gate insulating film GI can be formed on the second gate electrode G2 and the protective film 122. The top surface of the gate insulating film GI is expressed as being flat in FIG. 29, but it is not limited thereto. The gate insulating film GI may be formed in any shape or profile, as long as it is able to insulate the active layer ACT from the second gate electrode G2, and is able to cover the second gate electrode G2.

Since other processes of FIGS. 24 to 34 are identical or correspond to those of FIGS. 6 to 14, any redundant description will not be provided.

FIGS. 35 to 45 are cross-sectional views of fabricating processes of a display panel according to another embodiment of the present invention.

Referring to these drawings, the conductive wire patterns 121 can be formed on the substrate 110, and a protective film 122 spaced apart from the substrate 110 can be formed on the conductive wire patterns 121.

A method for forming the conductive wire patterns 121 includes, but is not limited only to, a nano-imprinting method, a DPT method, a BCP alignment patterning or the like.

Before forming the protective film 122, a hydrophobic treatment is performed on the surfaces of the conductive wire patterns 121. In this manner, it is possible to prevent the material of the protective film 122 from entering the space between the conductive wire patterns 121. Prevention of material from entering the spaces between wire patterns 121 is not limited thereto however, and may be accomplished by any suitable method.

The protective film 122 can be, but is not limited only to, one or more selected from the group consisting of, for example, SiOx, SiNx and SiOC. In one example, it may have a structure in which a SiOC layer is laminated on a SiOx layer. In this case, it is possible to perform the deposition only by a change in the raw material gas in the same chamber and conditions. Further, as the deposition rate of the SiOC layer is relatively high, it is possible to improve process efficiency.

The first gate electrode G1 can be formed on the protective film 122, the insulating layer 130 can be formed on the first gate electrode G1 and the protective film 122 over the whole surface, and the second gate electrode G2 can be formed on the insulating layer 130 to overlap the first gate electrode G1.

In one example, the first gate electrode G1 and the second gate electrode G2 can be formed using the same mask. It is possible to thereby reduce overall process cost, as the number of masks required is reduced.

The second gate electrode G2 can be formed simultaneously and integrally with the gate line GL of FIG. 1. In this case, the first gate electrode G1 can also be formed so as to have substantially the same profile as the gate line GL of FIG. 1. This is due to the use of the same mask.

Since other processes of FIGS. 35 to 45 are identical or correspond to those of FIGS. 15 to 23, redundant description will not be provided.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation. Accordingly, it is to be understood that principles of this invention may be embodied other than as specifically described herein. The different features of the various embodiments, disclosed or otherwise understood, can be mixed and matched in any manner to produce further embodiments within the scope of the invention. The invention is also defined in the following claims, and equivalents thereof.

What is claimed is:

1. A display panel comprising:
   a substrate;
   a gate line which is formed on the substrate and extends substantially in a first direction;
   a data line which is insulated from the gate line and extends substantially in a second direction;
   a thin film transistor which is electrically connected to the gate line and the data line; and
   a pixel electrode which is electrically connected to the thin film transistor,
   wherein the thin film transistor comprises:
      a gate electrode group which is formed on the substrate;
      a gate insulating film which is formed on the substrate and the gate electrode group;
      an active layer which is formed on the gate insulating film to at least partially overlap the gate electrode group; and
      a source electrode and a drain electrode which are formed on the active layer and the gate insulating film so as to be spaced apart from each other,
   wherein the gate electrode group includes a first gate electrode formed on the substrate, a second gate electrode formed on the first gate electrode, and an insulating layer interposed between the first gate electrode and the second gate electrode,
   wherein the first gate electrode has a reflectivity higher than that of the second gate electrode at wavelengths of light emitted from a light source, and
   wherein a thickness of the first gate electrode is less than that of the second gate electrode.

2. The display panel of claim 1, wherein the first gate electrode and the second gate electrode are electrically insulated from each other.

3. The display panel of claim 1, wherein the gate line is electrically connected to the second gate electrode.

4. The display panel of claim 1, further comprising a polarizing plate positioned between the substrate and the gate line.

5. The display panel of claim 4, wherein the polarizing plate is a wire grid polarizing plate which includes a plurality of parallel conductive wire patterns.

6. The display panel of claim 5, wherein the wire grid polarizing plate further includes an electrically insulating protective film positioned between the conductive wire patterns and the gate line.

7. The display panel of claim 1, wherein the first gate electrode has a thickness between about 10 nm and about 100 nm.

8. The display panel of claim 1, wherein the first gate electrode comprises at least one of aluminum and silver, and the second gate electrode comprises copper.

9. A method of fabricating a display panel, the method comprising:
   forming a first gate electrode on a substrate;
   forming an insulating layer on the first gate electrode;
   forming a second gate electrode on the insulating layer, the second gate electrode having a reflectivity lower than that of the first gate electrode at wavelengths of light emitted from a light source and a thickness greater than that of the first gate electrode;

forming a gate insulating film on the substrate and the second gate electrode;

forming an active layer on the gate insulating film so as to at least partially overlap the second gate electrode; and forming a source electrode and a drain electrode on the active layer at positions spaced apart from each other; and forming a pixel electrode which is electrically connected to the drain electrode.

10. The method of claim 9, wherein the forming a first gate electrode includes:

forming a wire grid polarizing plate on the substrate; and forming the first gate electrode on the wire grid polarizing plate.

11. The method of claim 10, wherein the forming a wire grid polarizing plate includes:

forming conductive wire patterns on the substrate; and forming a protective film on the conductive wire patterns.

12. The method of claim 9, wherein the first gate electrode comprises at least one of aluminum and silver, and the second gate electrode comprises copper.

* * * * *